(12) United States Patent
Hageman et al.

(10) Patent No.: US 6,535,083 B1
(45) Date of Patent: Mar. 18, 2003

(54) EMBEDDED RIDGE WAVEGUIDE FILTERS

(75) Inventors: Michael A. Hageman, Millersville, MD (US); John W. Gipprich, Millersville, MD (US); Daniel A. Stevens, Jr., Baltimore, MD (US); Kawthar Zaki, Potomac, MD (US)

(73) Assignee: Northrop Grumman Corporation, Los Angeles, CA (US)

( * ) Notice: Subject to any disclaimer, the term of this patent is extended or adjusted under 35 U.S.C. 154(b) by 0 days.

(21) Appl. No.: 09/944,599

(22) Filed: Sep. 4, 2001

Related U.S. Application Data
(60) Provisional application No. 60/229,536, filed on Sep. 5, 2000.

(51) Int. Cl.$^7$ ............................................. H01P 1/208
(52) U.S. Cl. ..................................... 333/210; 333/208
(58) Field of Search ................................ 333/208, 210, 333/239, 243, 212

(56) References Cited

U.S. PATENT DOCUMENTS

| | | | | |
|---|---|---|---|---|
| 5,150,088 A | * | 9/1992 | Virga et al. | 333/238 |
| 5,219,377 A | * | 6/1993 | Poradish | 333/247 |
| 5,382,931 A | | 1/1995 | Piloto et al. | 333/208 |
| 6,137,383 A | | 10/2000 | De Lillo | 333/210 |

OTHER PUBLICATIONS

Simon et al., "A Novel Coplanar Transmission line to Rectangular waveguide transition", 1998 IEEE MTT–S Digest, pp. 257–260 1998.*

Uchimura et al., Development of a "Laminated Waveguide", IEEE Trans. on Microwave & Tech., vol. 46, No. 12, pp. 2438–2443, Dec. 1998.*

Low Temperature Cofired Ceramic (LTCC) Ridge Waveguide Bandpass Filters, Yu Rong et al., WE3C–6, 1999 IEEE MTT–S Digest, pp. 1147–1150.

LTCC Wide–Band Ridge–Waveguide, Yu Rong et al., IEEE Transactions on Microwave Theory and Techniques, Vo. 47, No. 9, Sep., 1999, pp. 1836–1840.

Embedded Waveguide Filters for Microwave and Wireless Applications Using Cofired Ceramic Technologies, J. Gipprich et al., 1998 International Symposium on Microelectronics, pp. 1–4.

* cited by examiner

Primary Examiner—Seungsook Ham
(74) Attorney, Agent, or Firm—Birch, Stewart, Kolasch & Birch, LLP

(57) ABSTRACT

A ridge waveguide filter which is formed of metallized blind vias in a plurality of contiguous layers of a dielectric medium including low temperature cofired ceramic (LTCC), high temperature cofired ceramic (HTCC) or organic printed wiring boards (PWB) in the fabrication of the waveguide sidewalls and solid ground planes to provide top and bottom walls as well as in the formation of a plurality of ridge waveguide sections in an embedded ridge waveguide structure. Patterns of conductive metal are selectively printed on the outer surface of certain dielectric layers to electrically short all the vias in the ridge waveguide sections and the adjacent wall vias so that the elements behave as though they comprise a solid metal structure.

14 Claims, 3 Drawing Sheets

EMBEDDED RIDGE WAVEGUIDE FILTERS

This application claims the benefit of No. 60/229,536 file Sep. 5, 2000.

BACKGROUND OF THE INVENTION

1. Field of the Invention

This invention relates to ridge waveguide filters and more particularly to evanescent mode ridge waveguide filters embedded in multilayer ceramic structures.

2. Description of Related Art

Waveguide filters embedded in Low Temperature Cofired Ceramics (LTCC) are generally known. One such example is disclosed in U.S. Pat. No. 5,382,931, entitled "Waveguide Filters Having A Layered Dielectric Structure" which issued to A. J. Piloto et al. on Jan. 17, 1995. The Piloto et al. patent discloses the concept of waveguide filters having a dielectric structure for resonating at a predetermined frequency and having a series of longitudinally spaced resonators. A waveguide filter structure is disclosed where a predetermined number of contiguous layers of low temperature cofired ceramic (LTCC) are stacked, cofired and then plated with a conductive material. A series of vertically placed vias are positioned so as to form the perimeter of the filter.

The concept of evanescent mode waveguide bandpass filters including ridged waveguides with metal filled vias is also disclosed, for example, in the publication "Embedded Waveguide Filters For Microwave and Wireless Applications Using Co-fired Ceramic Technologies", J. Gipprich et al., 1998 International Symposium on Microelectronics, pp. 1–4.

A publication entitled "Low Temperature Co-fired Ceramic (LTCC) Ridge Waveguide Bandpass Filters", Y. Rong et al., 1999 IEEE MTT-S Digest, pp. 1147–1150 further discloses a ridge waveguide filter including a transition from a ridge waveguide member to stripline.

Other examples are well documented in the literature and can be referred to for further details of such devices.

SUMMARY

Accordingly, it is an object of the present invention to provide an improvement in waveguide filters.

It is a further object of the present invention to provide an improvement in ridge waveguide filters fabricated in a multi-layer dielectric medium.

It is yet another object of the present invention to provide an improvement in evanescent mode waveguide bandpass filters that are smaller in size, have lower insertion loss, exhibit wideband spurious suppression, and provide an easy transition to stripline transmission lines.

These and other objects are realized by a ridge waveguide filter which is formed of metallized blind vias in a plurality of contiguous layers of a dielectric medium including low temperature cofired ceramic (LTCC), high temperature cofired ceramic (HTCC) or organic printed wiring boards (PWB) in the fabrication of the waveguide sidewalls and solid ground planes to provide top and bottom walls as well as in the formation of a plurality of ridge waveguide sections in an embedded ridge waveguide structure. Patterns of conductive metal are selectively printed on the outer surface of certain dielectric layers to electrically short all the vias in the ridge waveguide sections and the adjacent wall vias so that the elements behave as though they comprise a solid metal structure.

Further scope of applicability of the present invention will become apparent from the detailed description provided hereinafter. It should be understood, however, that the detailed description and specific example, while disclosing the preferred embodiment of the invention, is provided by way of illustration only due to the fact that various changes and modifications coming within the spirit and scope of the invention will become apparent to those skilled in the art from this detailed description.

BRIEF DESCRIPTION OF THE DRAWINGS

The present invention will become more fully understood from the detailed description provided hereinafter when considered together with the accompanying drawings which are provided by way of illustration only and are thus not meant to be limitative of the invention, and wherein.

DETAILED DESCRIPTION OF THE INVENTION

Figure 1:
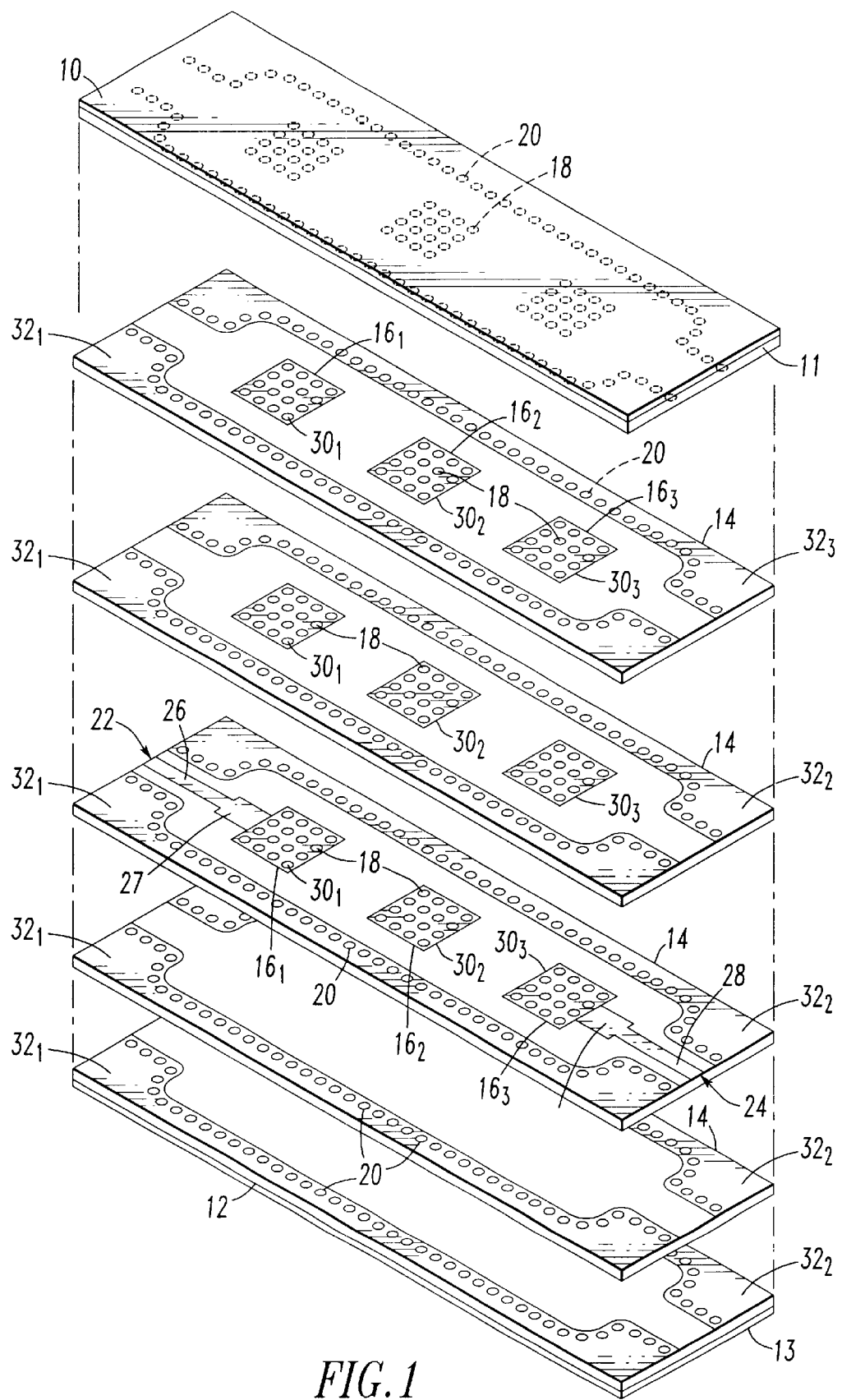
FIG. 1 is an exploded perspective view of an embedded ridge waveguide filter in accordance with the preferred embodiment of the subject invention.

Referring now to the drawings and more particularly to FIG. 1, shown thereat is an exploded view of an embedded ridge waveguide filter in accordance with the preferred embodiment of the invention. The filter is comprised of solid top and bottom ground plane layers of metallization 10 and 12 which are formed on respective outer layers of dielectric material 11 and 13 comprised preferably of low temperature cofired ceramic (LTCC) material. It should be noted, however that, when desirable, the dielectric layers 11, 13 and 14 can be fabricated from other dielectric material such as, for example, high temperature cofired ceramic (HTCC) and organic printed wiring board (PWB).

A plurality of contiguous intermediate LTCC layers 14 are shown located between the outer layers 11 and 13. The top and bottom ground plane layers 10 and 12 form the top and bottom walls, while the intermediate LTCC layers 14 make up the waveguide sidewalls.

Further as shown in FIG. 1, three longitudinally spaced evanescent mode ridge waveguide sections $16_1$, $16_2$ and $16_3$ are formed using matrices of blind metallized vias 18 including inner and outer vias which protrude through a predetermined number of contiguous LTCC layers 14 so that generally rectangular sets of ridge vias 18 in the form of matrices are mutually aligned one on top of the other. A linear configuration of metallized wall vias 20 which define the waveguide sidewalls are located along the side of the ridge waveguide sections $16_1$, $16_2$ and $16_3$ so as to define a perimeter of the waveguide filter. As shown, two lines of wall vias 20 narrow at their outer extremities so as to define input and output signal port 22 and 24. The narrowed portions of the via lines including sidewall vias 20 are adapted to accommodate ridge waveguide to stripline transition elements 26 and 28 including matching network sections 27 and 29.

Figure 2:
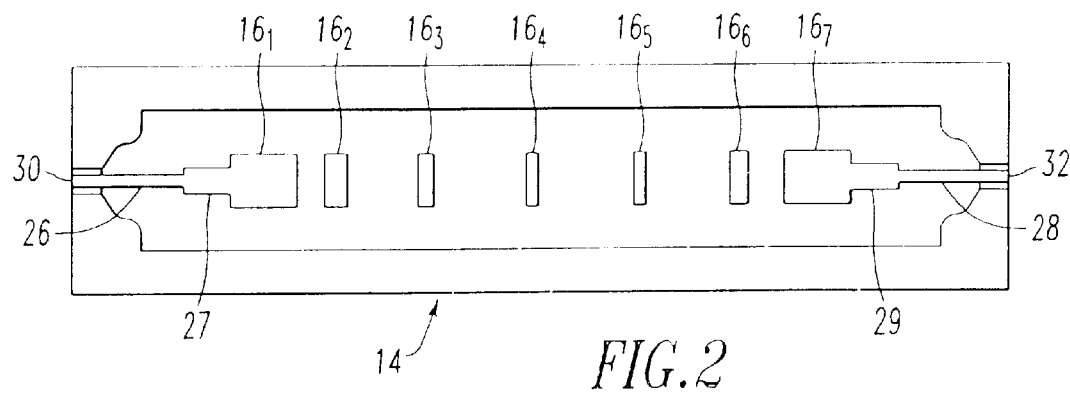
FIG. 2 is a plan view of an evanescent ridge waveguide filter including a plurality of longitudinally spaced ridge sections and having transitions from ridge waveguide to stripline to coplanar waveguide with ground.

Such an arrangement is further shown in the plan view of a ridge waveguide filter shown in FIG. 2 where, for example, the transition elements 26 and 28 further include coplanar waveguide with ground (CPWG) launch sections 30 and 32. Also whereas the configuration shown in FIG. 1 only includes three longitudinally spaced ridge waveguide sections $16_1$, $16_2$ and $16_3$, the filter shown in FIG. 2 includes seven ridge waveguide sections $16_1$, $16_2$ ... $16_7$. The signal path into and out of the filter is critical since it is desirable to use embedded waveguide filters in printed writing boards (PWBs) and substrates which commonly employ planar transmission lines such as microstrip, stripline and coplanar waveguide with ground. The CPWG launch sections 30 and 32 of FIG. 2 thus allow for an easy test capability using coplanar waveguide probing stations. Since the impedance of the waveguide is typically lower than 50 ohm system impedance, the matching network portions of 27 and 29 are included to perform an impedance matching function.

An important aspect of the subject invention comprises the addition of patterns of metallization 30 printed on the outer surfaces of the LTCC layers 14 to electrically short all vias in the matrices of ridge vias 18 and wall vias 20. This lowers via inductance and the ridge waveguide sections $16_1$, $16_2$ and $16_3$ act as solid elements.

As shown in FIG. 1, rectangular patches of metallization $30_1$, $30_2$ and $30_3$ are formed on one or both outer surfaces of the LTCC layers 14 so as to cover the sets of ridge vias 18 of the ridged waveguide sections $16_1$, $16_2$ and $16_3$. Likewise, perimeter patterns of metallization $32_1$ and $32_2$ are formed on the outer surfaces of the LTCC layers 14 which extend outwardly from the wall vias 20 to the outer peripheral edges of the respective LTCC layers.

Figure 3:
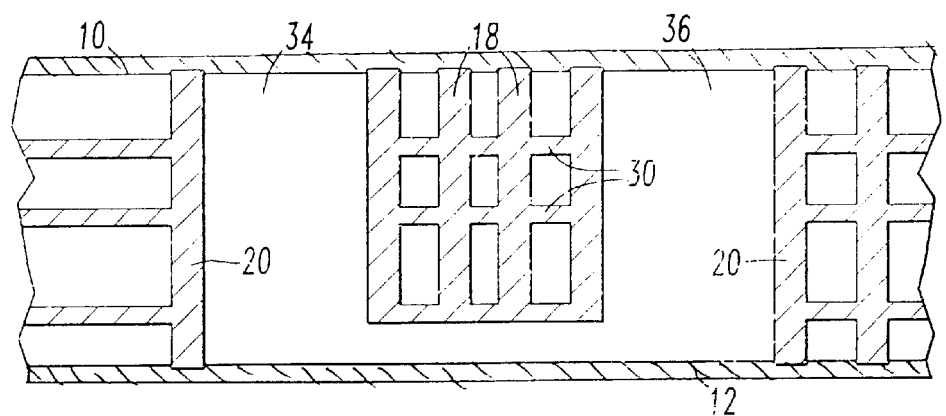
FIG. 3 is illustrative of a transverse cross-section of an embedded ridge waveguide filter in accordance with the subject invention.
Figure 4:
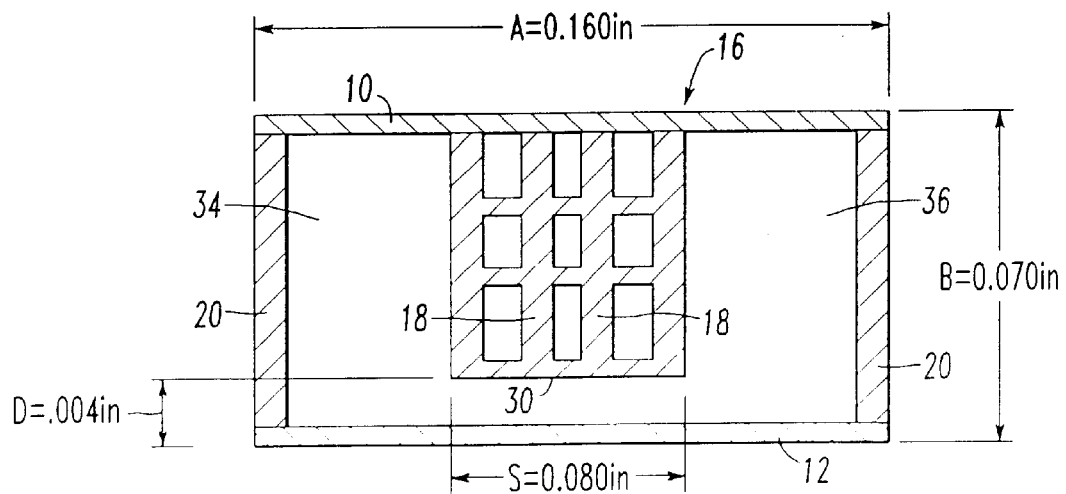
FIG. 4 is a diagram illustrative of the dimensions of an embedded ridge waveguide filter in accordance with the subject invention showing typical dimensions thereof.

Referring now to FIGS. 3 and 4, FIG. 3 is illustrative of an actual ridge waveguide filter illustrating the relative positions of the ridge vias 18 and the wall vias 20 between which are located regions of LTCC dielectric material 34 and 36 resulting from a process wherein the dielectric layers, for example 11, 12 and 14 shown in FIG. 1 are stacked together and cofired.

FIG. 4 is intended to illustrate the size of a typical embedded ridge waveguide filter in accordance with the subject invention. Accordingly, a transverse cross section of one of the ridge waveguide members 16 is shown having a width S=0.080 inches, and where the wall vias 20 are separated by a distance A=0.160 inches. The ridge waveguide member 16, moreover, does not extend to the bottom ground plane 12 as shown where, for example, the thickness of the filter has a dimension B=0.070, and the bottom surface of the waveguide ridge 16 is separated from the ground plane 12 by a distance D=0.014 inches.

Figure 5:
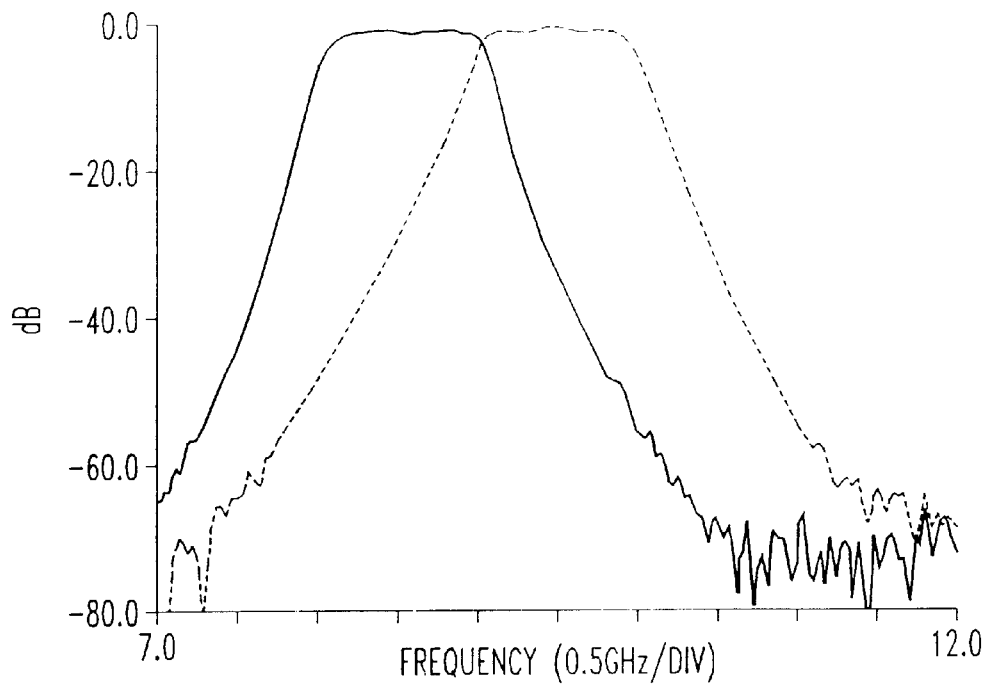
FIGS. 5 and 6 are illustrative of bandpass filter characteristics exhibited by filters fabricated in accordance with the subject invention.
Figure 6:
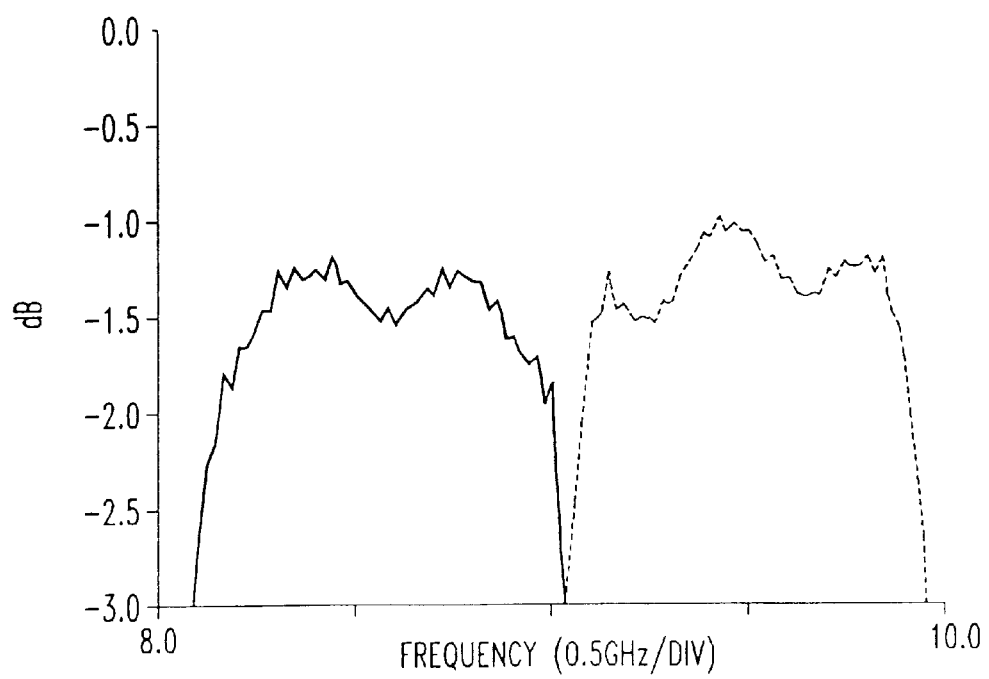

Empirically derived test data has indicated a significant advantage in the performance of ridge waveguide filters fabricated in accordance with the subject invention. The insertion loss is very low compared to embedded stripline filters, and the filters can be designed to eliminate spurious pass bands for use in switch filter banks with wideband application. The plot shown in FIGS. 5 and 6 depicts measured performance of several X-band filter designs. Moreover, designs have been generated and tested for LTCC and organic PWGs which have resulted in filters operable from 1 GHz to 20 GHz, with percentage bandwidths from 10%–50%.

It should be noted that additional dielectric layers, not shown, can be added above the top ground plane 10. Since the filter is embedded in a larger LTCC substrate, components can be mounted directly on the top of the filters. This allows for a more compact microwave module layout and components which are high heat dissipaters can be mounted directly on top of the ridge structures inasmuch as the vias 18 in the ridges 16 provide a low thermal resistance path through the LTCC substrate.

The foregoing detailed description merely illustrates the principles of the invention. It will thus be appreciated that those skilled in the art will be able to devise various arrangements which, although not explicitly described or shown herein, embody the principles of the invention and are thus within its spirit and scope.

What is claimed is:

1. A ridge waveguide filter, comprising:

a plurality of discrete evanescent mode ridge waveguide filter sections formed in a plurality of contiguous dielectric layers, said ridge waveguide filter sections consisting of a plurality of blind vias, arranged in a geometrical matrix pattern of inner and outer vias protruding through a selected number of the dielectric layers and having a pattern of metallization formed on an outer surface of the dielectric layers so as to short circuit all the vias in each of said ridge waveguide filter sections and thereby act as solid ridge filter sections.

2. A ridge waveguide filter according to claim 1 wherein said plurality of contiguous dielectric layers are comprised of dielectric material which is stacked and cofired.

3. A ridge waveguide filter according to claim 2 wherein said plurality of contiguous dielectric layers comprise layers of dielectric material selected from materials including low temperature cofired ceramic (LTCC), high temperature cofired ceramic (HTCC) and organic printed wiring board.

4. A ridge waveguide filter according to claim 3 and additionally including an arrangement of wall vias located to the side of the ridge waveguide sections and having a pattern of metallization to short circuit the wall vias and extending to the edge of the respective dielectric layers to form a perimeter of the filter.

5. A ridge waveguide filter according to claim 4 and additionally a layer of metallization on the outermost layers of said dielectric layers so as to provide a top and bottom ground plane.

6. A ridge waveguide filter according to claim 5 wherein said plurality of ridge waveguide sections terminate in an input port and an output port.

7. A ridge waveguide filter according to claim 6 wherein the input and output ports respectively include ridge waveguide transitions to a predetermined type of signal transmission line.

8. A ridge waveguide filter according to claim 7 wherein said predetermined type of transmission line comprises a planar transmission line.

9. A ridge waveguide filter according to claim 8 wherein said planar transmission line includes stripline, microstrip and coplanar waveguide with ground.

10. An evanescent mode ridge waveguide filter, comprising:

a plurality of contiguous layers of dielectric material including a top and bottom ground plane therein forming top and bottom walls, and a plurality of mutually spaced apart ridge waveguide filter sections therein, each comprised of a matrix of metallized blind vias which protrude through a predetermined number of layers of said plurality of contiguous layers, said matrices being arranged in mutually aligned sets of vias, a plurality of metallized wall vias located on both sides of the ridge waveguide filter sections defining thereby a perimeter of the filter, and patterns of electrically conductive material selectively fabricated on outer surfaces of said layers of dielectric material so as to electrically short circuit each matrix of vias of the respective ridge waveguide filter sections and the wall vias, whereby inductance of the vias is reduced and the ridge waveguide filter sections act substantially as discrete solid filter sections.

11. A ridge waveguide filter according to claim 10 wherein said plurality of contiguous dielectric layers comprise layers of dielectric material selected from materials including low temperature cofired ceramic (LTCC), high temperature cofired ceramic (HTCC) and organic printed wiring board.

12. A ridge waveguide filter according to claim 11 wherein the plurality of ridge waveguide sections are spaced apart longitudinally and terminate in an input port and an output port at opposite ends of the dielectric layers.

13. A ridge waveguide filter according to claim 12 wherein the input and output ports include a transmission line transition from ridge waveguide to stripline, microstrip or coplanar waveguide with ground.

14. A ridge waveguide filter according to claim 13 wherein said transition comprise planar transmission line elements including stripline, microstrip and coplanar waveguide with ground.

\* \* \* \* \*

UNITED STATES PATENT AND TRADEMARK OFFICE
CERTIFICATE OF CORRECTION

PATENT NO. : 6,535,083 B1  
DATED : March 18, 2003  
INVENTOR(S) : Michael A. Hageman et al.

It is certified that error appears in the above-identified patent and that said Letters Patent is hereby corrected as shown below:

<u>Title page</u>,
Item [73] should read:
-- [73] Assignee: Northrop Grumman Corporation, Los Angeles, CA (US) and, The University of Maryland, Riverdale, MD (US) --

Signed and Sealed this

Fifth Day of August, 2003

JAMES E. ROGAN
*Director of the United States Patent and Trademark Office*